United States Patent [19]

Liu

[11] Patent Number: 5,006,724

[45] Date of Patent: Apr. 9, 1991

[54] CONTROL DEVICE FOR LIGHT SETS

[76] Inventor: Ching-Chung Liu, No. 6 Lane 29, Pei-Yin Street, Hsin-Chu, Taiwan

[21] Appl. No.: 325,569

[22] Filed: Mar. 20, 1989

[51] Int. Cl.$^5$ .................. H03K 3/00; H05B 39/04
[52] U.S. Cl. ............................ 307/11; 315/158; 315/185 S; 315/185 R; 315/186; 315/294; 362/123
[58] Field of Search .............. 307/11; 315/158, 159, 315/294, 185 S, 185 R, 186; 362/122, 123, 121, 806, 807, 808

[56] References Cited

U.S. PATENT DOCUMENTS 4,236,101 11/1980 Luchaco .................. 315/158
4,275,335 6/1981 Ishida .................. 315/158 X
4,772,805 9/1988 Kawata .................. 307/10.8

Primary Examiner—A. D. Pellinen
Assistant Examiner—Sharon D. Logan
Attorney, Agent, or Firm—Henry M. Feiereisen

[57] ABSTRACT

A control device for varying the current flow through a load includes a power supply, a function generator connected to the power source and producing at least one output signal of triangular waveform, and power switching units for modulating the current flow through the load in dependence on the triangular output signal of the function generator so as to attain a smooth fading-in and fading-out effect.

23 Claims, 6 Drawing Sheets

CONTROL DEVICE FOR LIGHT SETS

BACKGROUND OF THE INVENTION

The present invention refers to a control device for varying the current flow through a load, in particular to intensity-modulation control device for decorative light sets such as Christmas tree light sets.

A simple light control device is known to be the bimetal flasher in which the different expansion coefficient of two metals of a strip is used to open and close the supply of power to a light string circuit to create a twinkling effect. Such flashers, however, do not allow special effects, such as fading-in or fading-out.

For creating fading or sequential moving effects, various other control systems have been proposed like e.g. described in U.S. Pat. No. 4,125,781 which refers to a Christmas tree lighting control to continuously change light intensities between strings through cooperation of contact pairs of duty cycle units with respective resistor disks driven by a motor. The disks are of varying configuration so that depending on the contact surface of the disks between the associated contact pairs, the resistance is altered to thereby change the duty cycle rate and thus the light intensity of the light strings. The duty cycle units may be variously constructed to include a SCR or DIAC and TRIAC combination. Apart from the high costs of such devices, the use of a gear motor as described in the U.S. Pat. No. 4,125,781 or also in U.S. Pat. No. 3,944,878 is undesired because of all the moving parts which will wear out and thus reduce the life of the device.

Other control systems describe the use of beat oscillators and digital technique to attain a desired light modulation. For example, U.S. Pat. No. 3,793,531 describes an electronic tree light controller which regulates the flow of electric power to lights or other loads by employing an electronic circuitry in which a solid state switch is used. The trigger actuation of the solid switch is made responsive to the difference frequency or an oscillator frequency beating against line frequency.

In control devices which utilize a beat oscillator, the beat signal of an adjustable oscillator and the 60 Hz AC line power is used to yield a sub-Hertz order of fading rate in the output such as e.g. 0.1 Hz. As a result, the fading rate is quite sensitive even to a small fraction of the frequency drift in the power line as well as in the oscillator. For example, in the case of a beat frequency of 0.1 Hz, a 1% drift in the line or oscillator frequency causes a significant 600% variation in the fading rate. As a result, such a device should be made with an external adjustment for permitting a user to manually adjust the beat frequency as it drifts away from the desired fading rate.

It was also proposed to employ two oscillators to beat each other for generating the fading rate through a digital circuit so as to produce sequential output signals. Such a system has the same drawbacks as previously outlined and thus are not reliable and stable as an external adjustment is required for compensating the drift in the power frequency for the triac circuits. Furthermore, the use of digital techniques renders such devices rather complicated in comparison to analog circuits in view of the required extra interfaces.

SUMMARY OF THE INVENTION

It is thus an object of the present invention to provide an improved light set control device obviating the afore-stated drawbacks.

This object and others which will become apparent hereinafter are attained in accordance with the present invention by providing a function generator which produces at least one output signal of triangular waveform, and a power switching unit for modulating the current flow through the load in dependence on the triangular output signal of the function generator for providing a smooth fading-in and fading-out effect.

Depending on the various load circuits involved, the power switching unit may be DC power switching units such as pulse width modulator (PWM) or phase control unit, or AC power control circuits including thyristor or triac.

According to one embodiment of the present invention, the function generator may be a single-stage CMOS function generator for producing one output signal or two output signals or may be a dual-stage CMOS function generator for producing four output signals. Each output signal of the function generator is of triangular waveform so that the current through the load such as a light set and thus the intensity thereof is changed smoothly with a fading-in and fading-out effect.

In the dual-stage function generator, the waveforms of the two output signals of each stage are complementary i.e. opposite in sign while the two stages are shifted in phase by a quarter period to thereby attain a sequentially varying pattern of the light set. Depending on the number of output signals, the function generator can thus produce a fading effect in a light set of one string, an alternating pattern in a light set of two strings, or a running pattern in a light set with four strings.

A dual-stage function generator according to the invention includes inverters, Schmitt triggers and a dual integrator with cross feedback paths to produce the sequentially changed output signals.

According to another feature of the present invention, a control device is provided which is connected or plugged in series with the controlled load such as e.g. a light string. Thus, a user can easily convert a conventional light set to incorporate such a control device. As the function generator has to be supplied at constant DC voltage and in view of the fact that a DC power supply circuit that operates under a constant AC input source may not operate properly in this circuit because of the source voltage variation caused by the series voltage drop of the light set, it is proposed to provide a power supply which operates both in the voltage mode i.e. low average input current and in the current mode i.e. high average input current.

This is accomplished by providing a voltage stabilizing circuit which includes a zener diode. Voltage is supplied to the zener diode via a resistor when the average modulated current in the light string is low, and via an energy storage and pumping circuit in which a capacitor is charged via a diode and is discharged through a further diode when the average modulated current in the light string exceeds a certain value. The zener diode thus basically receives voltage alternately from two sources to ensure the supply of voltage to the function generator at a constant level.

According to a further embodiment of the present invention, a control device is proposed which allows a crossed light-string configuration to be controlled without a common return wiring by dividing the power switching units such as pulse width modulators into two groups, with one group connected to the positive side and the other group connected to the negative side of a full-wave DC power supply. One end of each of the four light strings is connected to the output of the respective modulator and the other ends of the light strings are joined together to form a crossed light-string configuration through which the current may flow from the positive side to the negative side of the power supply. Since the four modulators are controlled by a function generator according to the present invention, the average current in the two light strings on the same polarity side is complementary. Consequently, the total current flowing into the junction point of the crossed light-string configuration is equal to the total current flowing away from this junction. There is thus no excess current at the junction so that no common return wiring is necessary.

The power switching units may be of the AC-type such as thyristor or triac in phase control units or DC-type such as various power transistors in pulse width modulators.

The power switching rates of the present invention are synchronized with the AC line frequency or the AC harmonic frequency and are as low as possible for achieving a minimum switching loss.

BRIEF DESCRIPTION OF THE DRAWING

The above and other objects, features and advantages of the present invention will now be described in more detail with reference to the accompanying drawing in which.

DETAILED DESCRIPTION OF PREFERRED EMBODIMENTS

Figure 1:
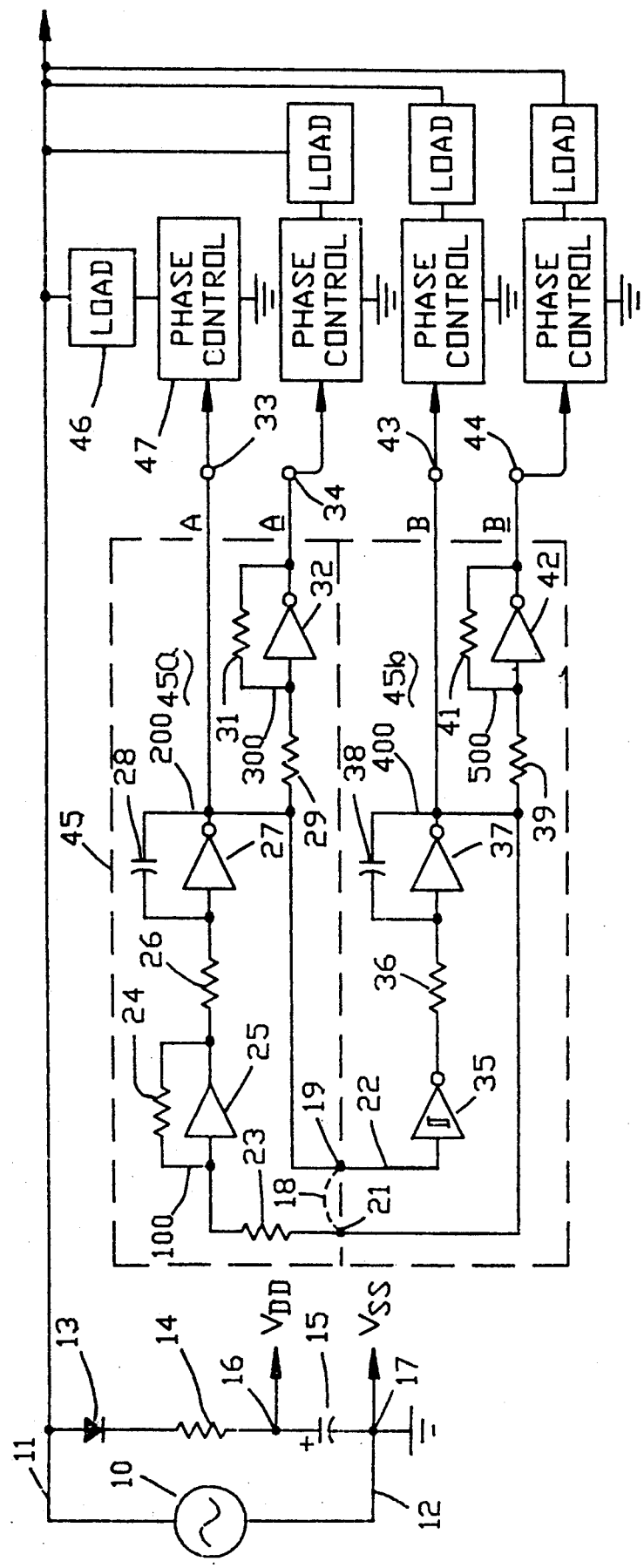
FIG. 1 is a schematic circuit block diagram of a first embodiment of a lighting control device in accordance with the invention, illustrating a four-way function generator for controlling the intensity of a light set.

Referring now to the drawing, and in particular to FIG. 1, there is shown a circuit block diagram of a first embodiment of the present invention, in particular a CMOS integrated four-way function generator in accordance with the present invention for providing output signals of triangular waveform. The function generator includes a number of components which are contained in a box as indicated by reference numeral 45.

A power source 10 which may be of conventional 60 cycle 120 volt alternating current as supplied in the United States or 50 cycle 220 volt alternating current as supplied in some European countries provides alternating current via lines 11 and 12, with line 11 connected to one or more loads 46 which may be typical 110 V or 220 V decorative light sets. The alternating current is converted to direct current by a diode 13 and a resistor 14. Capacitor 15 smoothes the waveform of the resulting direct current. The power from source 10 and converted in direct current is fed to the function generator 45 through terminals 16, 17 at potentials $V_{DD}$ and $V_{SS}$, with terminal 17 being grounded at potential $V_{SS}$.

In the nonlimiting example of FIG. 1, the function generator provides four output signals A, $\underline{A}$, B, $\underline{B}$ which control power switching units in form of phase control units 47 through respective terminals 33, 34, 43, 44. Each phase control unit 47 controls the duty cycle of the AC power on the associated load 46.

The function generator 45 is composed of a pair of coupled generator stages, that is a master stage 45a and a slave stage 45b. The master stage 45a is provided with a linear CMOS noninverting Schmitt trigger generally designated by reference numeral 100 and including a resistor 23, a noninverting buffer 25 and a further resistor 24 shunted to the buffer 25. Connected in series to the noninverting Schmitt trigger 100 is a linear CMOS integrator generally designated by reference numeral 200 and including a resistor 26, an inverting buffer 27 and a capacitor 28 shunted to the buffer 27.

The output of the noninverting Schmitt trigger 100 is a square wave which is fed as input to the integrator 200 providing an output signal A in form of a triangular wave which is fed via terminal 33 to the associated phase control unit 47. The output signal A provided by the integrator 200 is simultaneously fed into a linear CMOS inverter generally designated by reference numeral 300 and including a resistor 29, an inverting buffer 32 and a resistor 31 shunted to the buffer 32. The linear CMOS inverter 300 yields an inverted output signal $\underline{A}$ which is also of triangular waveform, however, shifted by 180° in phase and thus complementary to output A. The output signal $\underline{A}$ is connected to the associated phase control unit 47 via terminal 34.

Simultaneously, the output signal A is coupled with the slave stage 45b via line 22 and represents the input to an inverting Schmitt trigger 35. Connected in series with the Schmitt trigger 35 is an integrator generally designated by reference numeral 400 and including a resistor 36, an inverting buffer 37 and a capacitor 38 shunted to the buffer 37. The Schmitt trigger 35 provides an output signal in form of a square wave which is converted by the integrator 400 to an output signal B in form of a triangular wave. Since Schmitt trigger 35 is inverting, output signal A lags output signal B by a quarter period.

Output signal B of the slave stage 45b represents the input signal to the associated phase control unit 47 via terminal 43. As is further shown in FIG. 1, the output signal B is also connected to a linear CMOS inverter generally designated by reference numeral 500 and including a resistor 39, an inverting buffer 42 and a resistor 41 shunted to the buffer 42. The linear CMOS inverter 500 yields an inverted output signal $\underline{B}$ which is the input to the associated phase control unit 47 via terminal 44. The output signal $\underline{B}$ which is complementary to output B is also coupled back to the master stage 45a via terminal 21 and represents the input to the Schmitt trigger circuit 100. As Schmitt trigger 100 is non-inverting and of different type than the inverting Schmitt trigger 35, there is a quarter period shift between the master stage 45a and the slave stage 45b so that the output signal B leads output signal A by a quarter period. It will be readily recognized that the output B of the slave stage 45b is consistent with the input to the master stage 45a as both the output B and the input to the master stage 45a are of triangular waveform. Thus, the output signals A, B, $\underline{A}$, $\underline{B}$ in that sequence are thus separated by a quarter period to thereby attain a sequentially changing pattern. By producing output signals in triangular waveform as input to the phase control units 47, the duty cycle of the AC power in the loads 46 can be modulated.

Figure 2:
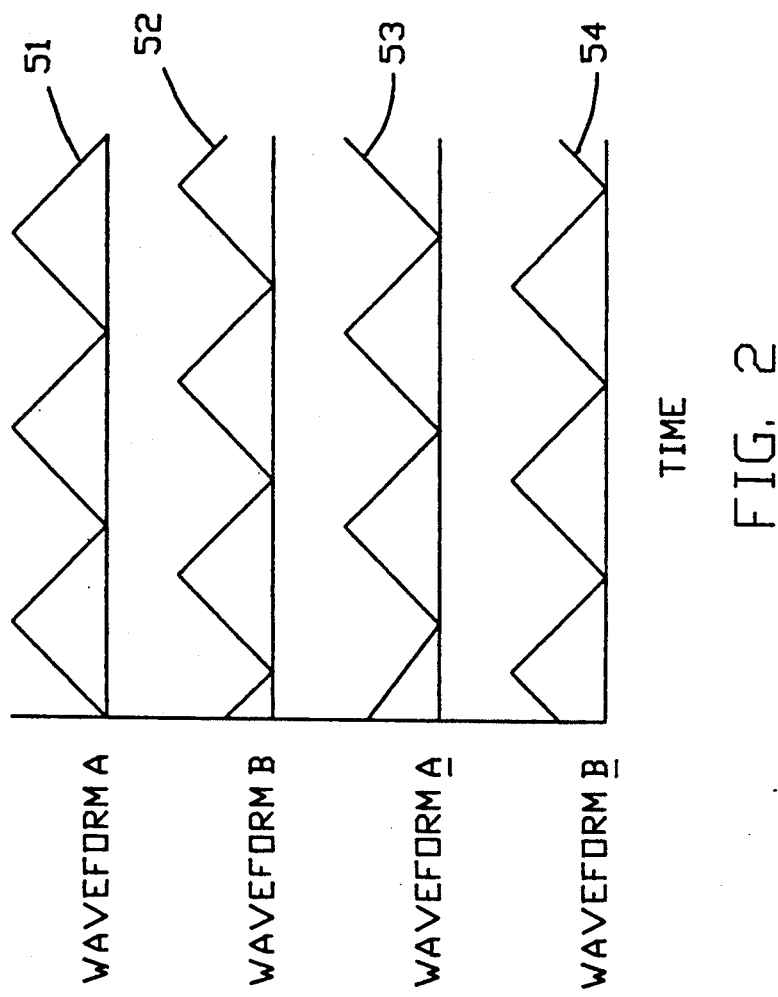
FIG. 2 is a plot of the output signals produced by the function generator of FIG. 1, illustrating the waveform and phase thereof.

Turning now to FIG. 2, there is shown a plot of the output signals A, $\underline{A}$, B, $\underline{B}$ as attained by the function generator 45 and plotted as an ordinate against time plotted as an abscissa. The output signals also represent the average intensity changes of four light strings which constitute the loads 46. Taking into consideration that the actual light string intensity varies at 120 or 100 Hz (AC source) and the frequency of the triangular waveform is in the range of sub Hz (fractions of 1 Hz), the average intensity is defined as the time-average of the intensity over one cycle of the AC source. As can be seen from FIG. 2, the output signals A, B, $\underline{A}$, $\underline{B}$ are shifted in phase by a quarter period so that the average intensities of the modulated light strings are changed accordingly to thereby attain a running pattern when the light strings are interwoven accordingly. Since the output signals A, $\underline{A}$, B, $\underline{B}$ are of triangular waveform, the change of intensity of the modulated light strings is gradual and smooth so as to give a superior fade-in and fade-out effect.

In the nonlimiting example of FIG. 1, the function generator includes two stages to yield four output signals. It will be readily recognized that such a function generator can easily be modified to produce only one or two output signals by disengaging the master stage 45a from the slave stage 45b at terminals 19 and 21 and connecting the terminals 19, 21 by a suitable line 18. In addition, the resistors 23, 24 should be adjusted to proper values.

The phase control units 47 respectively connected to the output signals A, $\underline{A}$, B, $\underline{B}$ are standard AC power control circuits including for example thyristor or triac. It should be noted, however, that alternatively, DC power switching units, such as pulse width modulator may be used as well by simply incorporating a full-wave rectifier which produces direct current.

Figure 3:
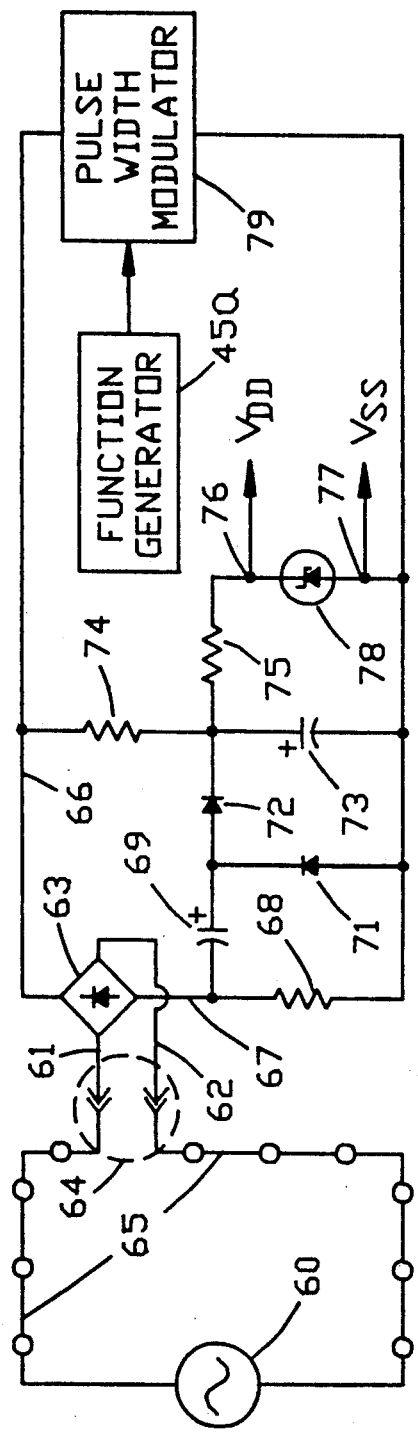
FIG. 3 is a schematic circuit block diagram of a second embodiment of a lighting control device in accordance with the invention connected in series with a light set for controlling the intensity thereof.

Turning now to FIG. 3, there is shown a circuit block diagram of a second embodiment of a control device in accordance with the present invention for controlling a conventional light string 65. The control device is connectable in series with a light string 65 by being directly plugged into one of the light-bulb sockets 64 via terminals 61, 62, and includes a function generator 45a which corresponds to the master stage of the function generator 45 as shown in FIG. 1, however, with only one output signal A which is fed to a pulse width modulator 79.

Since the pulse width modulator 79 only operates at DC power, the alternating current provided by the AC source 60 and fed to the light string 65 and to the control device should be converted to direct current before being supplied to the pulse width modulator 79 via terminal 61. Accordingly, a full-wave bridge rectifier 63 is interposed which rectifies the AC power to provide a rectified full wave DC power through positive line 66 and negative line 67 so that the pulse width modulator is connected across the full-wave bridge rectifier 63. The duty cycle interval of the rectified full wave power is then modulated by pulse width modulator 79 according to the output signal A of the function generator 45a. Thus the average power in the light string 65 is also modulated accordingly, as the light string 65 is connected in series with the control device.

It will be appreciated, however, that it is certainly feasible to substitute the pulse width modulator with a unidirectional phase control unit such as one including a thyristor.

The operation of the function generator 45a requires a supply of a constant DC voltage. Therefore, the control device includes a voltage stabilizing circuit which includes a capacitor 73, a resistor 75 and a zener diode 78. During periods when the average modulated current in the light string 65 is low, i.e. little voltage across the light string so that the voltage at the full-wave rectifier 63 is high, the rectified voltage is dropped by a resistor 74 to the appropriate level before being fed to the voltage stabilizing circuit. The capacitor 73 smoothes the ripples in the dropped voltage while the resistor 75 and the zener diode 78 attain a further fine-trimming to obtain a constant voltage output which is represented by $V_{DD}$ and $V_{SS}$ at output terminals 76, 77.

Connected to the voltage stabilizing circuit is a energy storage and pumping circuit which pumps power to the zener diode 78 when the voltage at the full-wave bridge rectifier 63 drops below a certain level at which point insufficient voltage is supplied to the zener diode 78 via resistor 74. The energy storage and pumping circuit includes a resistor 68 in the negative line 67, a diode 71, a capacitor 69 and a diode 72.

Thus, when the voltage at full-wave bridge rectifier 63 increases to a level sufficient to supply the zener diode 78 via the resistor 74, the capacitor 69 is charged through diode 71 to store energy. As the voltage at the full-wave bridge rectifier 63 drops below a certain level because the average modulated light string current is high i.e. small input current provided for the voltage stabilizing circuit through resistor 74, the capacitor 69 discharges and pumps the stored energy to capacitor 73 through diode 72 so as to supply the zener diode 78 with sufficient energy to maintain the voltage for the function generator 45a at a constant level.

Figure 4:
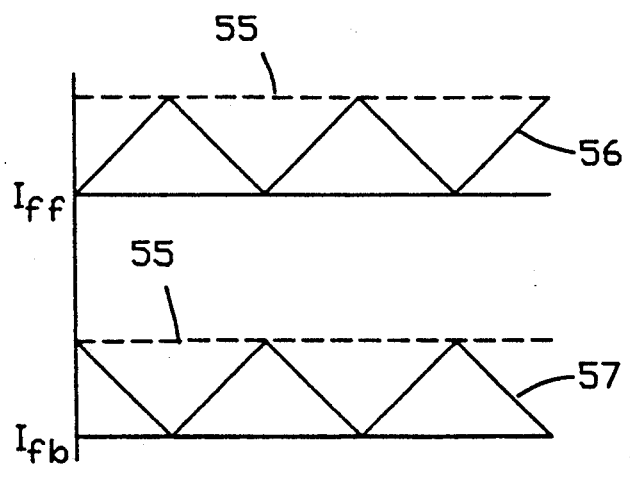
FIG. 4 is a plot of the approximated average current changes occurring in the power supply as shown in FIG. 3.

FIG. 4 shows the approximated relation between the average input current $I_{ff}$ represented by line 56 and flowing through resistor 74 into the voltage stabilizing circuit and thus to the zener diode 78, and the average input current $I_{fb}$ represented by line 57 and flowing through the diode 72 into the zener diode 78 of the voltage stabilizing circuit. As can be seen from FIG. 4, the current flowing through resistor 74 and the current pumped by the energy storage and pumping circuit alternately supply the voltage stabilizing circuit with the required input current to charge the capacitor 73 and to supply the zener diode 78 with sufficient voltage. The currents 56 and 57 are complementary to each other so that during a period when the light string 65 is at high average current state one current is high while the other current is low, and vice versa during low average current state. Thus, the total average current as indicated by broken line 55 and fed into the voltage stabilizing circuit is within a stable narrow range so that a normal operation of the voltage stabilizing circuit is attained regardless of the average current state of the controlled light string 65.

It should be noted that the resistor 68 may provide such high resistance that voltage at the capacitor 69 exceeds the voltage at capacitor 73 to thereby allow a current flow from capacitor 69 through diode 72 into capacitor 73 even when the voltage at resistor 74 is high. This measure ensures that the zener diode 78 is continuously supplied with voltage at a sufficient level.

Figure 5:
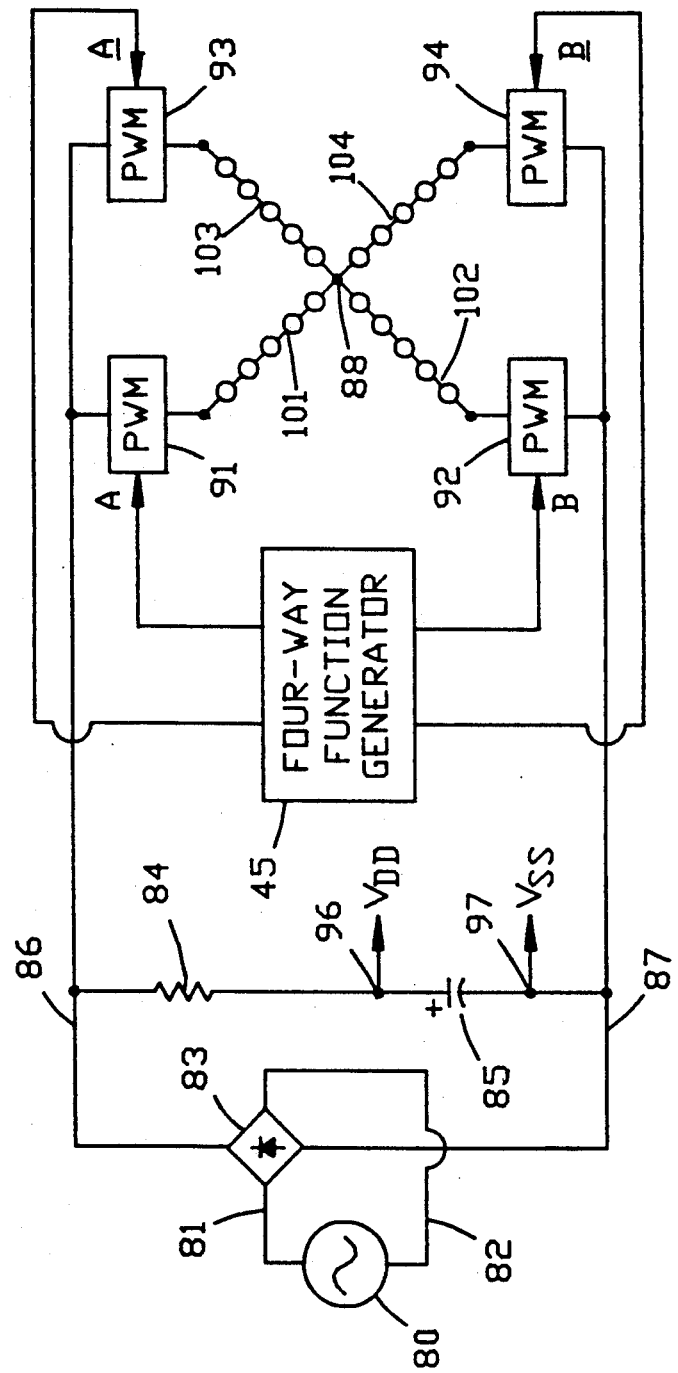
FIG. 5 is a schematic circuit block diagram of a third embodiment of a control device in accordance with the invention for controlling the intensity of four light strings.

Referring now to FIG. 5, there is shown a circuit block diagram of a third embodiment of a control device in accordance with the present invention for controlling the intensity of e.g. a four string light set such as light strings 101, 102, 103, 104. The light strings 101, 102, 103, 104 have one end thereof connected to respective pulse width modulators 91, 92, 93, 94 while the other ends thereof are joined to each other at junction 88, thereby avoiding the necessity to use a return wiring for the light strings as will be explained hereinafter.

The pulse width modulators 91, 92, 93, 94 are controlled by a function generator 45 in correspondence to the function generator as illustrated in FIG. 1 and thus produces four output signals A, B, $\bar{A}$, $\bar{B}$ to thereby provide a sequential intensity change of the light strings 101, 102, 103, 104. The alternating current supplied by the AC source 80 through power lines 81, 82 is converted to direct current by means of a full-wave bridge rectifier 83 so as to supply the pulse width modulators 91, 92, 93, 94 with full wave DC power via positive line 86 and negative line 87. The pulse width modulators 91, 92, 93, 94 are subdivided into two groups, with pulse width modulators 91, 93 being connected to the positive side of the full-wave bridge rectifier 83 and being of the p-type semiconductor device while pulse width modulators 92, 94 are connected to the negative side of the full-wave bridge rectifier 83 and are of the n-type semiconductor device.

Since the output signals A, B, $\bar{A}$, $\bar{B}$ of the function generator 45 are at a much lower potential level than the positive side of the full-wave bridge rectifier 83, potential-boosting interface circuits are provided to elevate the potentials of output signals A, $\bar{A}$ to a level comparable to the positive side of the full-wave bridge rectifier 83 in order to allow control of the pulse width modulators 91, 93. For ease of illustration, such potential-boosting interface circuits are not shown in the block diagram. The pulse width modulators 92, 94 located at the negative side of the bridge rectifier 83 are at a comparable level of potential in comparison to the output signals of the function generator 45 so that potential-boosting interface circuits are not required for the pulse width modulators 92, 94.

As already previously set forth, the CMOS function generator 45 requires constant DC voltage to operate properly. To attain such constant voltage, the rectified voltage is dropped by a resistor 84, and ripples thereof are smoothed out by a capacitor 85. The constant voltage output as represented by potentials $V_{DD}$ and $V_{SS}$ is provided at terminals 96 and 97.

Figure 6:
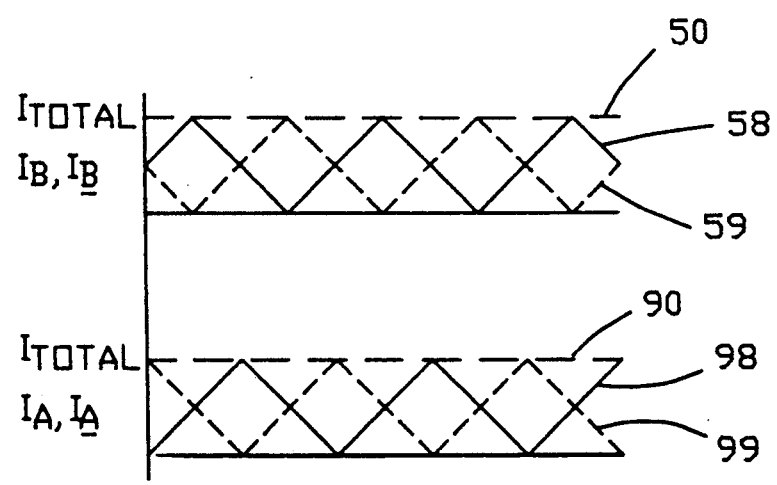
FIG. 6 is a plot of average currents in the light strings of the crossed light string network as shown in FIG. 5.

The potentials of the crossed light strings 101, 102, 103, 104 are floating. Since, however, the function generator 45 produces four output signals A, $\bar{A}$; B, $\bar{B}$ which are complementary, the average total current in the light strings 101 and 103 and the average total current in the light strings 102 and 104 are constant as illustrated in FIG. 6 in which $I_A$ represented by line 98 and $I_{\bar{A}}$ represented by line 99 are average currents in light strings 101, 103, and $I_B$ represented by line 58 and $I_{\bar{B}}$ represented by line 59 are average currents in light strings 102, 104. $I_{total}$ represented by line 90 is the total average current of $I_A$ and $I_{\bar{A}}$, and $I_{total}$ represented by line 50 is the total average current of $I_B$ and $I_{\bar{B}}$.

The reason that no return wiring is necessary for the light strings when using the four-way function generator 45 according to the invention resides in the fact that there is no excess current at junction 88. According to Kirchhoff's laws, the current flowing to a given point in a circuit is equal to the current flowing away from that point. In the nonlimiting example of FIG. 5, the total current flowing into junction 88 ($I_{total}$ 90) is equal to the total current flowing away from junction 88 ($I_{total}$ 50).

While the invention has been illustrated and described as embodied in a control device for a light set, it is not intended to be limited to the details shown since various modifications and structural changes may be made without departing in any way from the spirit of the present invention.

What is claimed as new and desired to be protected by Letters Patent is set forth in the appended claims:

1. A control device for varying the current flow through a load, comprising:
   a power supply;
   a function generator having terminals connectable to said power supply and producing at least one output signal of triangular waveform; and
   power switching means for modulating the current flow through the load in dependence on said triangular output signal of said unction generator to attain a gradual increase and decrease of the current flow through the load, said function generator having a first stage including a linear CMOS noninverting Schmitt trigger producing an output signal of square waveform, and a linear CMOS integrator connected in series with said linear CMOS noninverting Schmitt trigger, said output signal of square waveform being fed into said linear CMOS intergrator which produces said one output signal of triangular waveform.

2. A control device as defined in claim 1 wherein said first stage of said function generator produces a second output signal of triangular waveform, said first and second output signals being shifted in phase by 180° and thus complementary to each other.

3. A control device as defined in claim 2 wherein said function generator includes a linear CMOS inverter for inverting said first output signal so as to provide said second output signal.

4. A control device as defined in claim 2 wherein said function generator has a second stage which is coupled to said first stage and shifted in phase by a quarter period relative to said first stage, said second stage producing a third output signal and a fourth output signal of triangular waveform which are complementary to each other so that said first, second, third and fourth output signals are sequentially shifted in phase relative to each other by a quarter period.

5. A control device as defined in claim 4 wherein said second stage of said function generator includes an inverting Schmitt trigger and an integrator in series with said Schmitt trigger, said first output signal of triangular waveform being fed to said inverting Schmitt trigger the output of which is input to said integrator producing said third output signal which leads said first output signal by a quarter period.

6. A control device as defined in claim 5 wherein said second stage of said function generator further includes a linear CMOS inverter, said third output signal being fed to said linear CMOS inverter to produce said fourth output signal of triangular waveform.

7. A control device as defined in claim 1 wherein said power switching means is a AC power control circuit.

8. A control device as defined in claim 7 wherein said power switching means includes a thyristor.

9. A control device as defined in claim 7 wherein said power switching means includes a triac.

10. A control device as defined in claim 9 wherein said power switching means includes a phase control unit.

11. A control device as defined in claim 1 wherein said power switching means is a DC power control circuit.

12. A control device as defined in claim 11 wherein said power switching means includes a pulse width modulator.

13. A control device for varying the current flow through a light set for modulating the light intensity thereof, with the light set being connected to an AC power supply, said control device being connected in series with the light set and comprising:
rectifying means for converting the AC power to provide a DC power supply;
a function generator having terminals connectable to said DC power supply and producing at least one output signal of triangular waveform; and
power switching means connected to said DC power supply and modulating the current flow through the light set in dependence on said triangular output signal of said function generator for providing a gradual increase and decrease of the current flow to thereby attain a fading-in and fading-out effect of the light set,
said DC power supply including a voltage stabilizing circuit supplying said function generator with constant voltage, and an energy storage and pumping circuit for supplying said voltage stabilizing circuit with input current when the voltage at said rectifying means drops below a predetermined level, said energy storage and pumping circuit including a pair of diodes and a capacitor, said capacitor being charged through one of said diodes when the voltage at said rectifying means is sufficiently high and being discharged through the other one of said diodes when the voltage at said rectifying means drops below a predetermined level so that said voltage stabilizing circuit is continuously fed with sufficient energy to maintain constant voltage for said function generator.

14. A control device as defined in claim 13, and further comprising resistor means for dropping voltage from said rectifying means to a predetermined level before applied to said voltage stabilizing circuit.

15. A control device as defined in claim 13 wherein said voltage stabilizing circuit includes a zener diode.

16. A control device for varying the current flow through a four string light set for modulating the light intensity thereof, said control device comprising:
rectifying means for converting AC power to provide a DC power supply defined by a positive side and a negative side;
a function generator having terminals connectable to said DC power supply and producing four output signals of triangular waveform separated from each other by a quarter period; and
power switching means connected to said DC power supply and modulating the current flow through the light set in dependence on aid triangular output signals of said function generator for providing a gradual increase and decrease of the current flow to thereby attain a fading-in and fading-out effect of each string of the light set,
said power switching means being subdivided into two groups, with one group being coupled to the positive side of said power supply and connected with one end of two such strings of the light set, and with the other group being coupled to the negative side of said power supply and connected to one end of the other two such strings of the light set.

17. A control device as defined in claim 16 wherein each string has another end, said other ends of the strings of the light set being joined together to define a cross-linked configuration.

18. A control device for varying the current flow through a load, with the control device being connected in series with the load, comprising:
a power supply;
a function generator having terminals connectable to said power supply and producing at least one output signal of triangular waveform;
power switching means for modulating the current flow through the load in dependence on said triangular output signal of said function generator to attain a gradual increase and decrease of the current flow through the load;
a voltage stabilizing circuit supplying said function generator with constant voltage; and
an energy storage and pumping circuit for supplying said voltage stabilizing circuit with input current when the voltage at said power supply drops below a predetermined level.

19. A control device as defined in claim 18 wherein said voltage stabilizing circuit includes a zener diode regulating the voltage to said function generator and being supplied with input current from said power supply.

20. A control device as defined in claim 18 wherein said energy storage and pumping circuit includes a pair of diodes and a capacitor, said capacitor being charged through one of said diodes when the voltage at said power supply is sufficiently high and being discharged through the other one of said diodes when the voltage at said power supply drops below a predetermined level so that said voltage stabilizing circuit is continuously fed with sufficient energy to maintain constant voltage for said function generator.

21. A control device for varying the current flow through a load, with the load being a light set of four strings, comprising:
a power supply being defined by a positive side and a negative side;
a function generator having terminals connectable to said power supply and producing at least one output signal of triangular waveform;
power switching means for modulating the current flow through the load in dependence on said triangular output signal of said function generator to attain a gradual increase and decrease of the current flow through the load,
said function generator producing four output signals of triangular waveform separated from each other by a quarter period and cooperating with said power switching means, said power switching means being subdivided into two groups, with one group being coupled to the positive side of said power supply and connected with one end of two such strings of the light set, and with the other group being coupled to the negative side of said power supply and connected to one end of the other two such strings of the light set.

22. A control device as defined in claim 21 wherein each string has another end, said other ends of the strings of the light set being joined together to define a cross-linked configuration.

23. A control device for varying the current flow through a load, comprising:
- a power supply being defined by a positive side and a negative side;
- a function generator having terminals connectable to said power supply and producing at least one output signal of triangular waveform;
- power switching means for modulating the current flow through the load in dependence on said triangular output signal of said function generator to attain a gradual increase and decrease of the current flow though the load, said power switching means being a AC power control circuit and including a triac and a phase control unit.

* * * * *